(12) United States Patent
Zuniga et al.

(10) Patent No.: US 8,431,450 B1
(45) Date of Patent: Apr. 30, 2013

(54) METHODS AND APPARATUS FOR LDMOS TRANSISTORS

(75) Inventors: Marco A. Zuniga, Fremont, CA (US); Budong You, Fremont, CA (US); Yang Lu, Fremont, CA (US)

(73) Assignee: Volterra Semiconductor Corporation, Fremont, CA (US)

( * ) Notice: Subject to any disclaimer, the term of this patent is extended or adjusted under 35 U.S.C. 154(b) by 0 days.

(21) Appl. No.: 12/987,905

(22) Filed: Jan. 10, 2011

Related U.S. Application Data

(63) Continuation of application No. 11/488,378, filed on Jul. 17, 2006, now Pat. No. 7,868, 378.

(60) Provisional application No. 60/700,395, filed on Jul. 18, 2005.

(51) Int. Cl.
| | |
|---|---|
| *H01L 29/66* | (2006.01) |
| *H01L 21/02* | (2006.01) |
| *H01L 21/84* | (2006.01) |
| *H01L 21/8238* | (2006.01) |

(52) U.S. Cl.
USPC ........... 438/163; 257/328; 257/333; 257/493; 257/557; 257/611; 257/E29.187; 257/E29.261; 257/E21.373; 257/E21.452; 438/204; 438/236; 438/316; 438/325; 438/327; 438/335

(58) Field of Classification Search ............ 438/163, 438/204, 236, 316, 325, 327, 335; 257/328, 257/492–493, 556–557, 575, 611, E29.187, 257/E29.261, E21.373, E21.41–E21.414, 257/E21.452
See application file for complete search history.

(56) References Cited

U.S. PATENT DOCUMENTS

| | | | |
|---|---|---|---|
| 5,406,110 A | 4/1995 | Kwon et al. | |
| 5,517,046 A * | 5/1996 | Hsing et al. | 257/336 |
| 6,211,552 B1 * | 4/2001 | Efland et al. | 257/343 |
| 6,258,674 B1 * | 7/2001 | Kwon et al. | 438/286 |
| 6,380,566 B1 * | 4/2002 | Matsudai et al. | 257/175 |
| 6,483,149 B1 * | 11/2002 | Mosher et al. | 257/356 |
| 6,559,504 B2 * | 5/2003 | Nishibe et al. | 257/343 |
| 6,825,531 B1 * | 11/2004 | Mallikarjunaswamy | 257/343 |
| 6,927,453 B2 * | 8/2005 | Shibib et al. | 257/336 |
| 7,868,378 B1 * | 1/2011 | Zuniga et al. | 257/328 |
| 2003/0038316 A1 * | 2/2003 | Tsuchiko et al. | 257/324 |
| 2004/0065935 A1 * | 4/2004 | Lee et al. | 257/492 |
| 2004/0238913 A1 * | 12/2004 | Kwon et al. | 257/492 |
| 2005/0110080 A1 * | 5/2005 | Arnborg et al. | 257/335 |
| 2006/0113625 A1 * | 6/2006 | Bude et al. | 257/491 |
| 2007/0007591 A1 * | 1/2007 | Theeuwen et al. | 257/340 |
| 2007/0296022 A1 * | 12/2007 | Lu et al. | 257/316 |

* cited by examiner

*Primary Examiner* — Matthew W Such
*Assistant Examiner* — Jeremy Joy
(74) *Attorney, Agent, or Firm* — Fish & Richardson P.C.

(57) ABSTRACT

An LDMOS transistor includes a gate including a conductive material over an insulator material, a source including a first impurity region and a second impurity region, a third impurity region, and a drain including a fourth impurity region and a fifth impurity region. The first impurity region is of a first type, and the second impurity region is of an opposite second type. The third impurity region extends from the source region under the gate and is of the first type. The fourth impurity region is of the second type, the fifth impurity region is of the second type, and the fourth impurity region impinges the third impurity region.

8 Claims, 6 Drawing Sheets

METHODS AND APPARATUS FOR LDMOS TRANSISTORS

CROSS-REFERENCE TO RELATED APPLICATIONS

This application is a continuation and claims the benefit of priority under 35 U.S.C. Section 120 of U.S. application Ser. No. 11/488,378, filed Jul. 17, 2006, now issued as U.S. Pat. No. 7,868,378, which claims priority to U.S. Application Ser. No. 60/700,395, filed on Jul. 18, 2005. The disclosure of each prior application is considered part of and is incorporated by reference in the disclosure of this application.

TECHNICAL FIELD

The following disclosure relates to semiconductor devices, and more particularly to transistors, such as lateral double-diffused MOSFET (LDMOS) transistors.

BACKGROUND

Voltage regulators, such as DC to DC converters, are used to provide stable voltage sources for electronic systems. Efficient DC to DC converters are particularly needed for battery management in low power devices, such as laptop notebooks and cellular phones. Switching voltage regulators (or simply "switching regulators") are known to be an efficient type of DC to DC converter. A switching regulator generates an output voltage by converting an input DC voltage into a high frequency voltage, and filtering the high frequency input voltage to generate the output DC voltage. Specifically, the switching regulator includes a switch for alternately coupling and decoupling an input DC voltage source, such as a battery, to a load, such as an integrated circuit. An output filter, typically including an inductor and a capacitor, is coupled between the input voltage source and the load to filter the output of the switch and thus provide the output DC voltage. A controller, such as a pulse width modulator or a pulse frequency modulator, controls the switch to maintain a substantially constant output DC voltage.

LDMOS transistors are commonly used in switching regulators as a result of their performance in terms of a tradeoff between their specific on-resistance ($R_{dson}$) and drain-to-source breakdown voltage ($BV_{d\_s}$). Conventional LDMOS transistors are typically fabricated having optimized device performance characteristics through a complex process, such as a Bipolar-CMOS (BiCMOS) process or a Bipolar-CMOS-DMOS (BCD) process, that includes one or more process steps that are not compatible with sub-micron CMOS processes typically used by foundries specializing in production of large volumes of digital CMOS devices (e.g, 0.5 μm DRAM production technologies), as described in greater detail below. As a result, conventional LDMOS transistors are, therefore, not typically fabricated at such foundries.

SUMMARY

In one aspect, the invention is directed to method of fabricating a transistor having a source, drain, and a gate on a substrate. The method includes implanting a first impurity region, forming a gate insulator between a source region and a drain region of the transistor, covering the gate insulator with a conductive material, and implanting, into the drain region of the transistor, a second impurity region. The first impurity region has a first volume and a first surface area and is of a first type, the gate insulator covers a portion of the first surface area, and the second impurity region has a second volume and a second surface area and is of an opposite second impurity type, the second volume impinging the first volume.

In another aspect, the invention is directed to a transistor. The transistor includes a gate including a conductive material over an insulator material, a source including a first impurity region and a second impurity region, a third impurity region, and a drain including a fourth impurity region and a fifth impurity region. The first impurity region is of a first type, and the second impurity region is of an opposite second type. The third impurity region extends from the source region under the gate and is of the first type. The fourth impurity region is of the second type, the fifth impurity region is of the second type, and the fourth impurity region impinges the third impurity region.

In another aspect, the invention is directed to a transistor. The transistor includes a gate with a conductive material over an insulator material, a source including a first impurity region and a second impurity region, a third impurity region, a drain including a fourth impurity region and a fifth impurity region, and a resurf impurity region. The first impurity region is of a first type, the second impurity region is of an opposite second type, the third impurity region is of the first type, the fourth impurity region is of the second type, the fifth impurity region is of the second type, and the resurf impurity region is of the first type. The third impurity region extends from the source region under the gate, and the resurf impurity region extends laterally beneath a portion of the fourth impurity region.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1A:
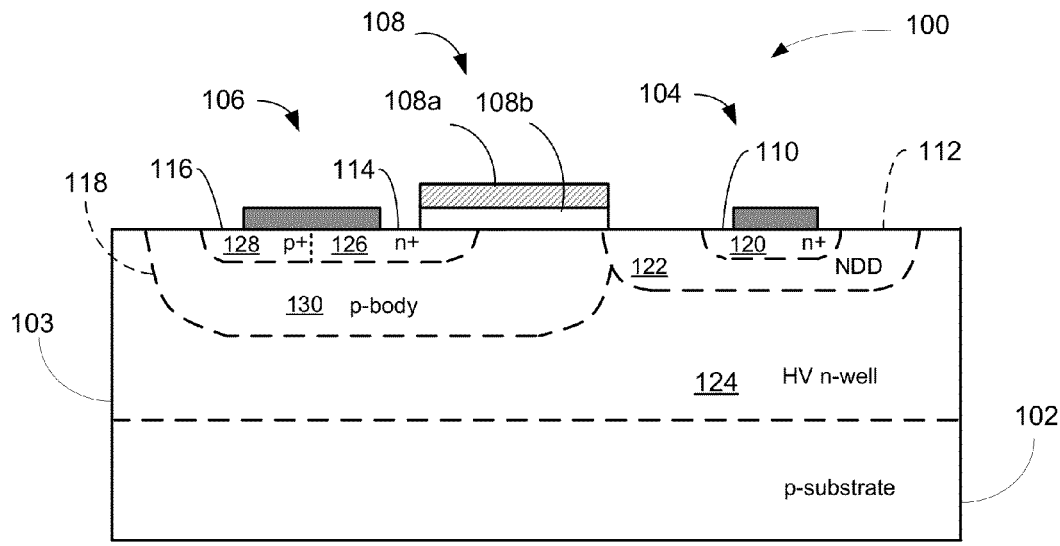
FIG. 1A is a schematic cross-sectional view of an LDMOS transistor.

FIG. 1A shows a schematic cross-sectional view of an LDMOS transistor 100. This LDMOS transistor 100 can be a switch in a switched-mode power supply voltage regulator operable to convert an input DC voltage into a high frequency voltage.

The LDMOS transistor 100 can be fabricated on a high voltage n-type well (HV n-well) 103 implanted in a p-type substrate 102. An HV n-well implant is typically a deep implant and is generally more lightly doped relative to a CMOS n-well. HV n-well 103 can have a retrograded vertical doping profile.

The LDMOS transistor 100 includes a drain region 104, a source region 106, and a gate 108. The gate 108 includes a gate conductor layer 108b and a gate oxide 108a. The gate can also include an oxide spacer formed around the gate conductor layer 108b and gate oxide 108a. The drain region 104 includes an n-doped n+ region 110 and an n-doped drain (NDD) 112. Although illustrated as spaced from the gate oxide 108a, the n+ region 110 can be self-aligned to the gate (e.g., so that the edge of the n+ region 120 is aligned with the outer edge of the oxide spacer). The source region 106 includes an n-doped n+ region 114 and a p-doped p+ region 116. The n+ region 114 of the source 106 can include an N-LDD implanted after creation of the gate oxide but before formation of oxide spacer, and an n+ implanted after formation of the oxide spacer. In one implementation, the n+ region 114 of the source 106 includes an N-LDD but the n+ region 110 of the drain 104 does not include an N-LDD.

Figure 1B:
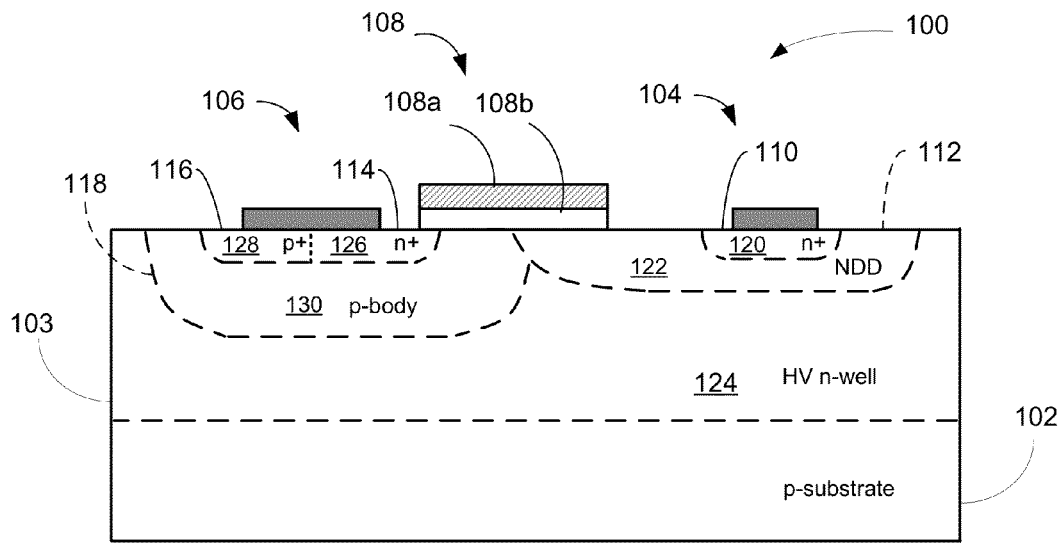
FIG. 1B is a schematic cross-sectional view of another implementation of an LDMOS transistor.

A p-doped P-body 118, at least a portion of which can be considered part of the source region 106, extends beneath the gate 108 and abuts the NDD 112. A portion of the n+ region 114 can extend partially beneath the gate 108. The interface between the P-body 118 and the NDD 112 can be aligned with the drain-side edge of the gate 108. Alternatively, as shown in FIG. 1B, the interface between the P-body 118 and the NDD 112 can be positioned beneath the gate 108. In general, placement of the interface at the drain-side edge of the gate can be useful for high-frequency applications, whereas placement of the interface nearer to the source-side edge of the gate 108 can be useful for high-power applications.

The HV n-well 103, the NDD 112, and the n+ region 110 in drain region 104 are volumes composed of doped material generated by discrete implant steps. Both the NDD 112 and the HV n-well 103 are generated with implant steps which have a lower concentration of impurities than the implant steps which generate the n+ regions 110, 114. Of course, portions at which these volumes overlap have a higher doping concentration than the individual volumes separately. A portion 120 that contains the overlapping volumes of the n+ region 110, the NDD 112, and the HV n-well 103 has the highest doping concentration of all the overlapping volume portions. A portion 122 that contains the overlapping volumes of the NDD 112 and the HV n-well 103, but not the n+ region 110, has a lower doping concentration than portion 120. A portion 124 that only includes the HV n-well 103 has a lower doping concentration than either portions 120 or 122 because it does not include multiple overlapping doped volumes. Likewise, the n+ region 114, the p+ region 116, and the P-body 118 in source region 106 are volumes (126, 128, and 130, respectively) composed of doped material.

Figure 2:
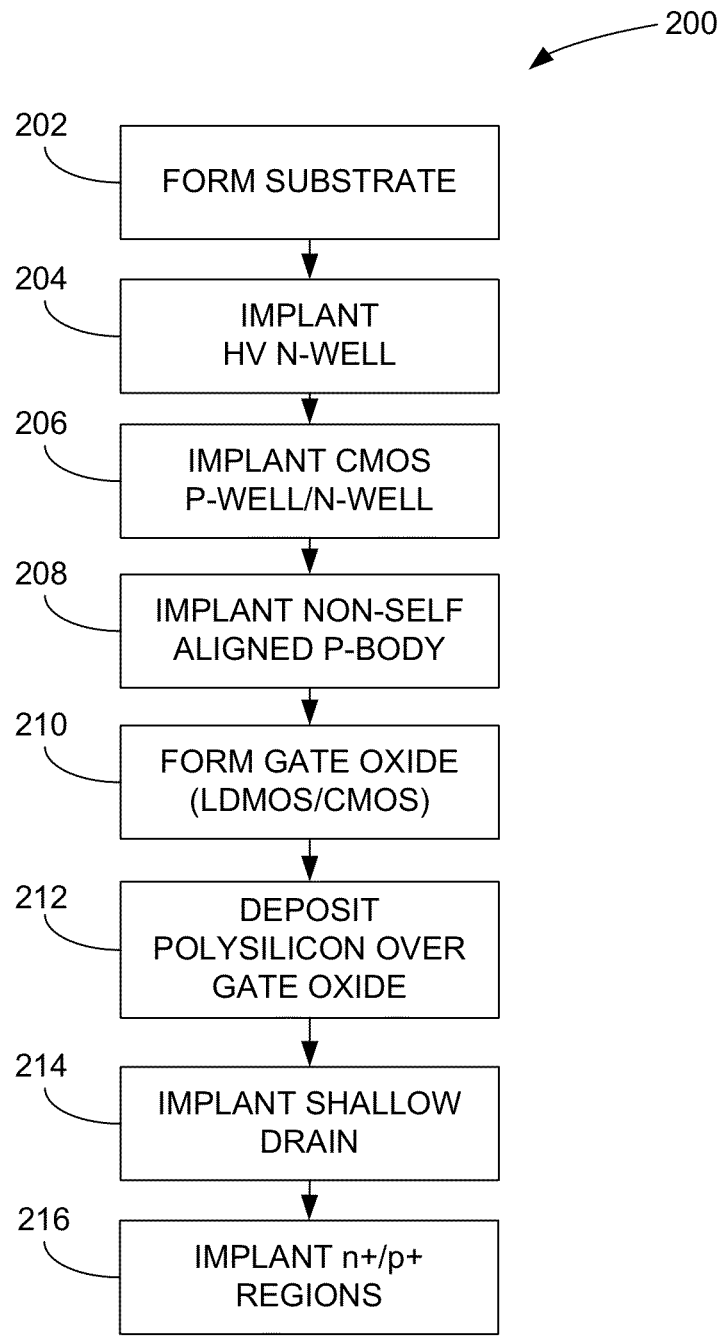
FIG. 2 is a flow diagram of a process for manufacturing an LDMOS transistor.

FIG. 2 illustrates a process 200 of fabricating a semiconductor device, including an LDMOS transistor. Conventional CMOS transistors can also be fabricated through process 200.

Figure 3A:
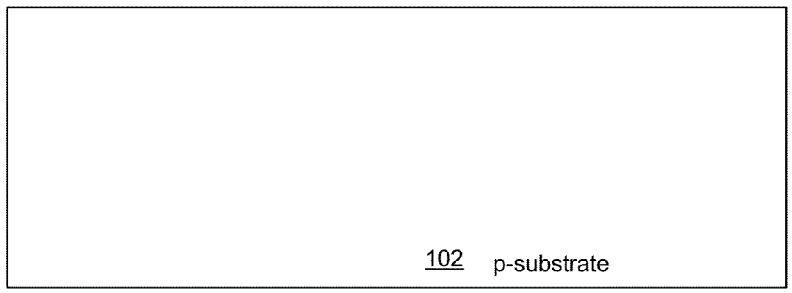
FIGS. 3A-3G illustrate a process for manufacturing an LDMOS transistor.
Figure 3B:
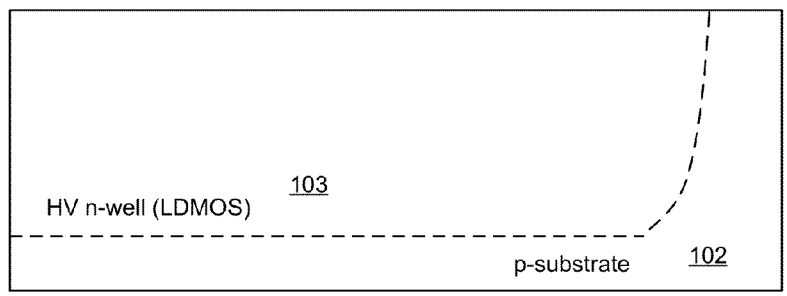
Figure 3C:
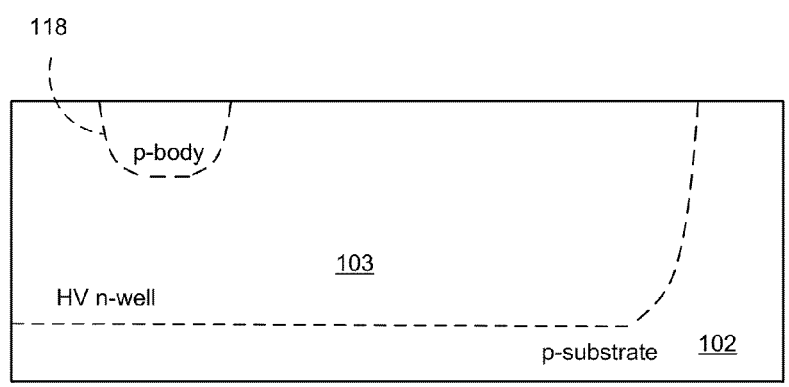

The process 100 begins with forming a substrate (step 202). The substrate can be a p type substrate or an n type substrate. Referring to the example of FIG. 3A, a semiconductor layer consisting of a p-type substrate 102 is formed. As shown in FIG. 3B, an HV n-well 103 for the LDMOS transistor is implanted into the substrate (step 204). In addition, an n-well for a the PMOS transistor with floating operation capability, or NMOS transistor with floating operation capability can be implanted. Optionally, unillustrated CMOS n-wells for conventional PMOS transistors and unillustrated CMOS p-wells for conventional NMOS transistors can be implanted into the substrate (step 206). A non self-aligned P-body 118 for the drain region of the LDMOS transistor is implanted (step 208). As shown in FIG. 3C, the P-body 118 is implanted into the HV n well 103. During step 206, a P-body can also be implanted for the NMOS transistor with floating operation capability.

The gate oxide for each of the LDMOS transistor is formed (step 210). The gate oxide for other components, such as the PMOS transistor with floating operation capability, and the NMOS transistor with floating operation capability, and the conventional CMOS transistors can also be formed. The gate oxide for the LDMOS transistor can be formed at the same time as a gate oxide of the conventional CMOS transistors. The LDMOS transistor can, therefore, have a similar threshold voltage and gate oxide thickness and as the conventional CMOS transistors, and can be driven directly by conventional CMOS logic circuits. Alternatively, the gate oxide of the LDMOS transistor can formed at a different time than the gate oxide of the conventional CMOS transistors to allow the LDMOS transistor to be implemented with a dedicated thick gate oxide. When implemented with a thick gate oxide, the LDMOS transistor allows for higher gate drive in applications where a lower voltage power supply may not be readily available. This flexibility allows for optimization of the LDMOS transistor depending on specific requirements of a power delivery application, such as efficiency targets at a particular frequency of operation.

Figure 3D:
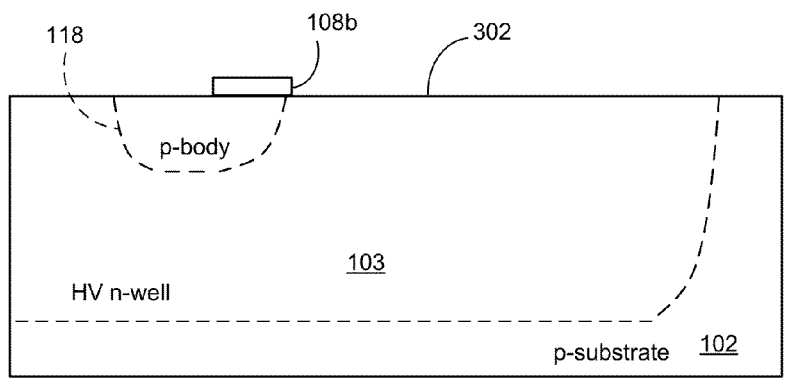
Figure 3E:
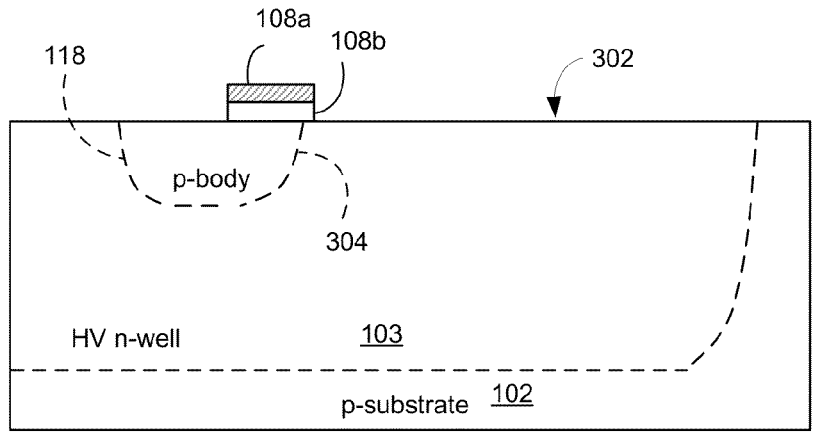

Referring to the example of FIG. 3D, the LDMOS gate oxide 108a is formed on a surface 302 of the substrate such that drain-side edge of the gate is aligned with an inner edge 304 of the P-body 118, or such that the gate overlies the inner edge 304 of the P-body 118. Exact alignment is not required, as the final position of the interface between the P-body and NDD will be determined by the NDD implant step. A polysilicon layer is deposited over the gate oxide (step 210). As shown in FIG. 3E, a polysilicon layer 108a is deposited over the LDMOS gate oxide 108b. A polysilicon layer can also be deposited over the conventional PMOS and NMOS gates.

Figure 3F:
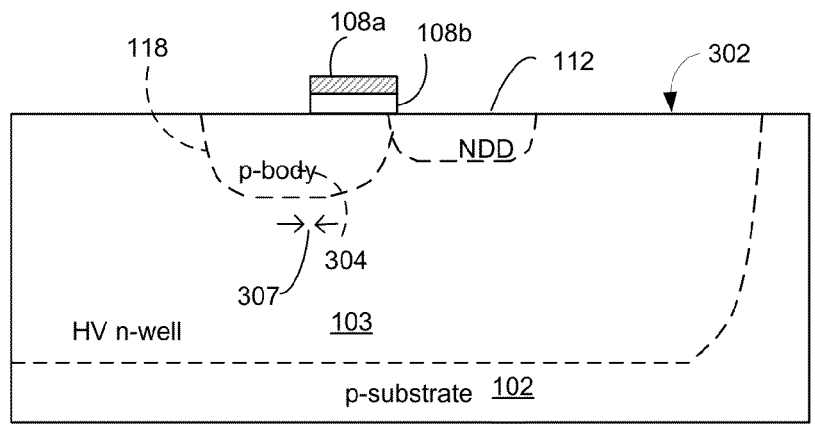
Figure 3G:
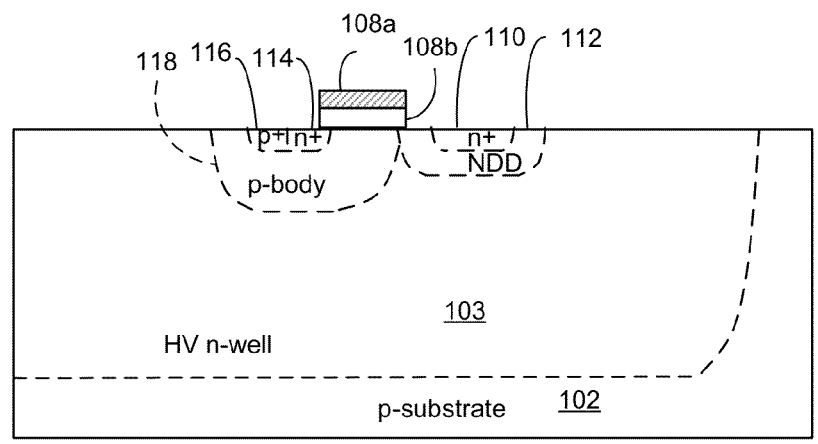

A shallow drain is implanted and diffused into the drain of the LDMOS transistor (step 114). The shallow drain can be implanted after the LDMOS gate is formed so that the shallow drain is self aligned with respect to the LDMOS gate. The shallow drain can be implanted through a LAT implant or a normal angle tilt implant. In the example of FIG. 3F, the shallow drain is the n-doped drain NDD 112.

The n-doped drain NDD 112 is implanted such that the NDD abuts the P-body 118. In addition, by controlling the diffusion process, the distance 307 by which the NDD extends under the gate 108 can be controlled. Thus, the position of the interface between the NDD and the P-body can be controlled in an aligned fashion relative to the drain-side edge of the gate 108. The spacing 307 can be sized such that that the NDD 112 implant extends a predetermined distance under the LDMOS gate. The doping concentration of NDD is can be greater than the P-body so that the NDD implant extends into the P-body to define the channel.

The n+ regions and p+ regions of the LDMOS transistor, the PMOS transistor with floating operation capability, and the NMOS transistor with floating operation capability, and the conventional CMOS transistors, are implanted (step 216). A p+ region 116 is implanted at the source of the LDMOS transistor. The LDMOS transistor also include an n+ region 110 implanted at the drain and an n+ region 114 implanted at the source.

The process 200 provides several potential advantages. First, the P-body of the LDMOS transistor is implanted and diffused prior to formation of the gate oxide of the conventional CMOS transistors. The thermal cycle associated with the P-body implant therefore does not substantially affect the fixed thermal budget associated with sub-micron CMOS process steps (e.g., process step 206). Second, the placement of the interface between the P-body and the NDD can be tightly controlled due to the self-alignment of the NDD relative to the gate.

Figure 4:
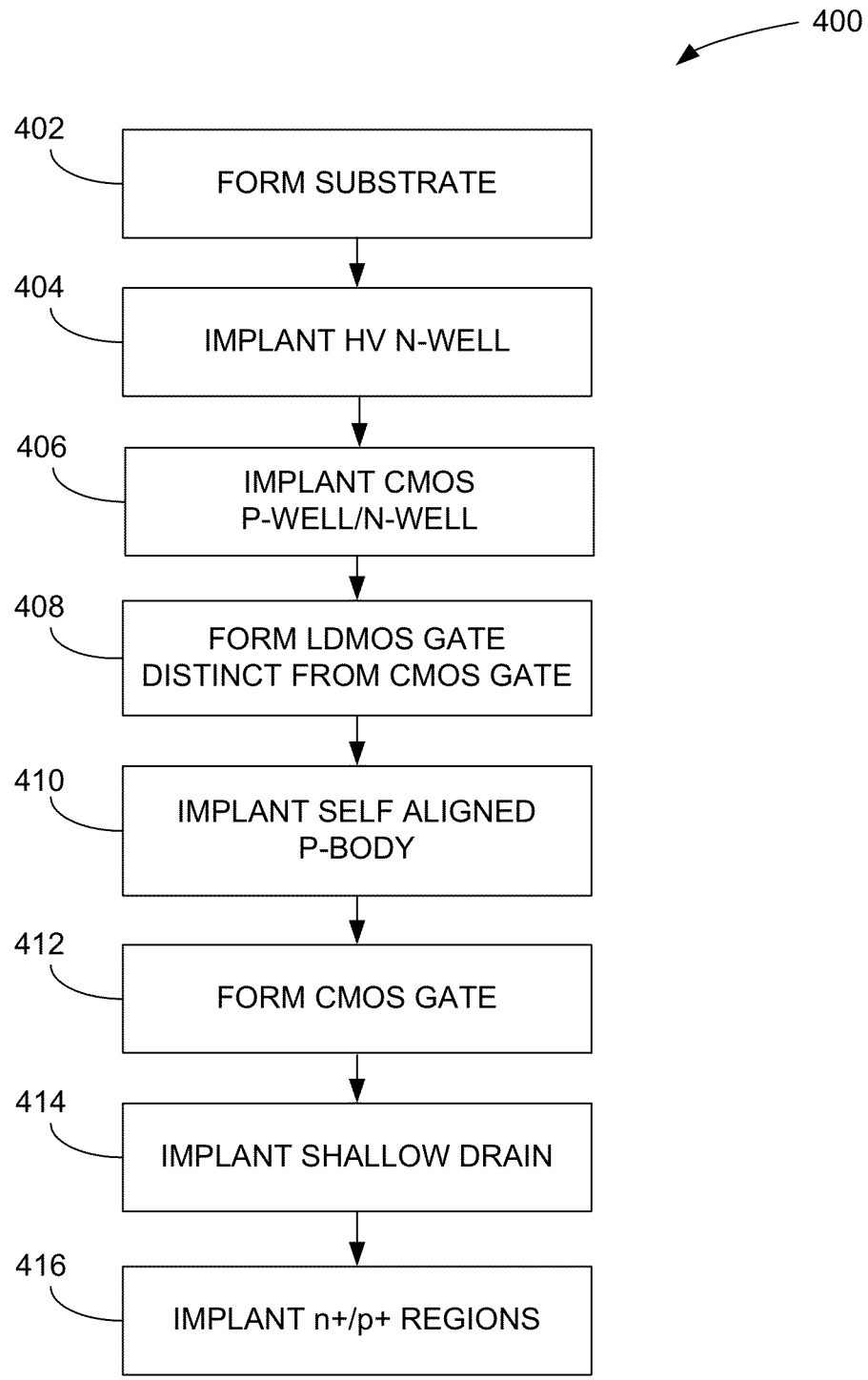
FIG. 4 is a flow diagram of another implementation of a process for manufacturing an LDMOS transistor.

Referring to FIG. 4, although the process described above forms the gate 108 after the P-body 118 is implanted, it is also possible for the P-body 118 to be implanted after formation of the gate 108, so that the P-body is self-aligned relative to the gate. In this case, the CMOS gates can be formed after the P-body implant. Alternatively, if the thermal budget permits, the CMOS gates can be formed at the same time as the LDMOS gate.

Figure 5:
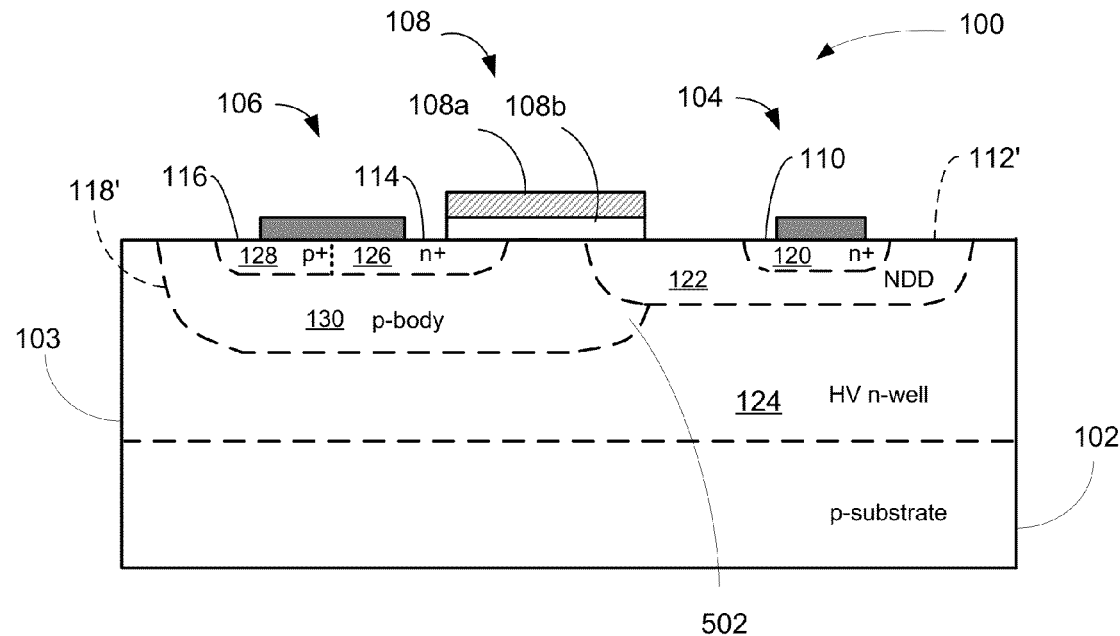
FIG. 5 is a schematic cross-sectional view of another implementation of an LDMOS transistor.

The NDD 112 can be shallower than the P-body 118. Referring to FIG. 5, in another implementation, during the NDD implant step, the NDD 112' is driven beneath the gate 108 and into the P-body 118' such that the P-body has a portion 502 that extends laterally beneath the NDD 112'. This portion 502 can provide an implanted resurf region that reduces the peak surface electric field, particularly near the drain-side edge of the gate.

Figure 6:
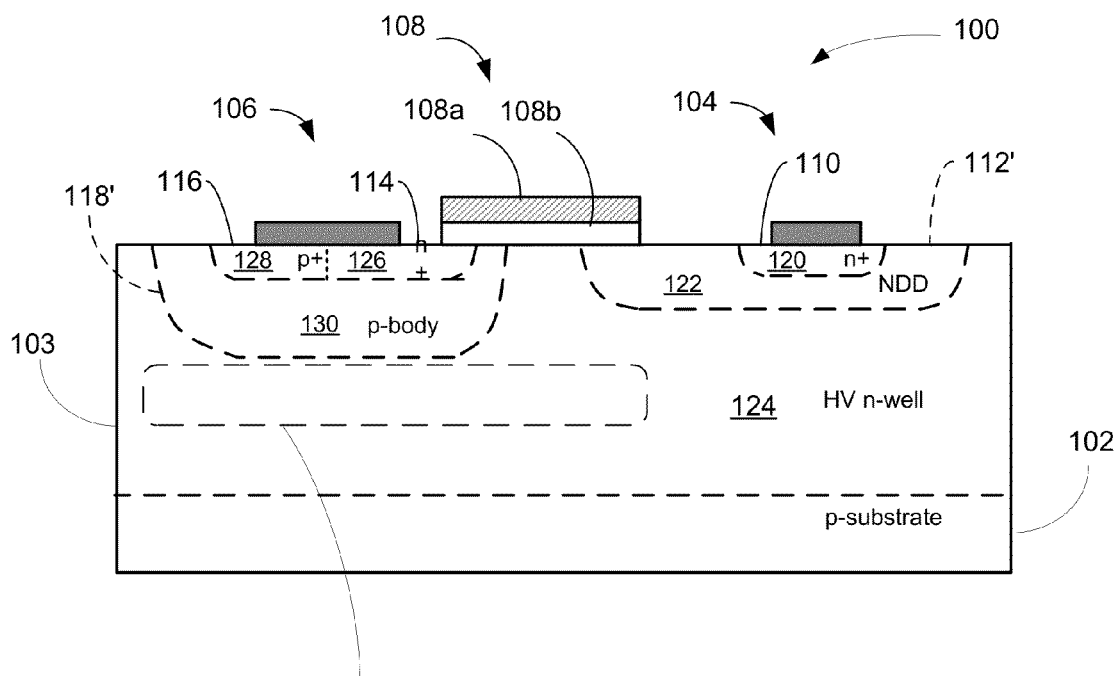
FIG. 6 is a schematic cross-sectional view of another implementation of an LDMOS transistor.

Referring to FIG. 6, in another implementation, the a p-resurf implant is performed to produce a p-resurf region 602 that extends below NDD 112. The p-resurf region the can extend over just the source and gate as illustrated, or it can extend across the entire n-well. In addition, the p-resurf region can be spaced from the P-body and NDD, or in contact with one or both of the P-body and NDD. This portion p-resurf region 602 can reduce the peak surface electric field, particularly near the drain-side edge of the gate.

Reduction of the peak surface electric field can reduce hot carrier degradation, thus permitting the devices to be scaled smaller while maintaining device lifetime.

A number of embodiments of the invention have been described. Nevertheless, it will be understood that various modifications may be made without departing from the spirit and scope of the invention. Accordingly, other embodiments are within the scope of the following claims.

What is claimed is:

1. A method of fabricating a transistor having a source, drain, and a gate on a substrate, the method comprising:

implanting a first impurity region with a first volume and a first surface area, the first region being of a first type;

forming a gate insulator between a source region and a drain region of the transistor, the gate insulator covering a portion of the first surface area including aligning a drain-side edge of the gate insulator with a drain-side edge of the first impurity region;

covering the gate insulator with a conductive material; and implanting, into the drain region of the transistor, a second impurity region with a second volume and a second surface area with a second impurity type, the second volume in contact with the first volume, the second region being of an opposite second type.

2. The method of claim 1, further comprising:

implanting into the source region, a third impurity region with a third volume and a third surface area, and a fourth impurity region with a fourth volume and a fourth surface area, the third impurity region being of the first type, the fourth impurity region being of the opposite second type; and implanting, into the drain region of the transistor, a fifth impurity region with a fifth volume and a fifth surface area, the fifth impurity region being of the second type.

3. The method of claim 2, wherein the third impurity region and the fourth impurity region are implanted in the first impurity region and the fifth impurity region is implanted in the second impurity region.

4. The method of claim 3, wherein the step of implanting the second impurity region uses a lower impurity concentration than the step of implanting the fifth impurity region.

5. The method of claim 1, wherein implanting the second impurity region occurs after forming the gate insulator.

6. The method of claim 1, wherein forming the gate insulator includes aligning a drain-side edge of the gate insulator with a drain-side edge of the first impurity region.

7. The method of claim 1, wherein forming the gate insulator includes forming the gate insulator to extend over a drain-side edge of the first impurity region.

8. The method of claim 1, wherein implanting the second impurity region causes the first impurity region to extend laterally beneath a portion of the second volume.

* * * * *